US012437964B2

(12) United States Patent
Maeda et al.

(10) Patent No.: US 12,437,964 B2
(45) Date of Patent: Oct. 7, 2025

(54) LIGHT-EMITTING BODY, ELECTRON BEAM DETECTOR, AND SCANNING ELECTRON MICROSCOPE

(71) Applicant: HAMAMATSU PHOTONICS K.K., Hamamatsu (JP)

(72) Inventors: Junya Maeda, Hamamatsu (JP); Kyogo Kaneko, Hamamatsu (JP); Kuniyoshi Yamauchi, Hamamatsu (JP)

(73) Assignee: HAMAMATSU PHOTONICS K.K., Hamamatsu (JP)

( * ) Notice: Subject to any disclaimer, the term of this patent is extended or adjusted under 35 U.S.C. 154(b) by 497 days.

(21) Appl. No.: 17/775,993

(22) PCT Filed: Nov. 30, 2020

(86) PCT No.: PCT/JP2020/044496
§ 371 (c)(1),
(2) Date: May 11, 2022

(87) PCT Pub. No.: WO2021/145078
PCT Pub. Date: Jul. 22, 2021

(65) Prior Publication Data

US 2022/0392740 A1 Dec. 8, 2022

(30) Foreign Application Priority Data

Jan. 17, 2020 (JP) ................................ 2020-006121

(51) Int. Cl.
*H01J 37/244* (2006.01)
*H01J 37/18* (2006.01)
*H01J 37/28* (2006.01)

(52) U.S. Cl.
CPC ........... *H01J 37/244* (2013.01); *H01J 37/18* (2013.01); *H01J 37/28* (2013.01)

(58) Field of Classification Search
CPC .......... H01J 37/00; H01J 37/02; H01J 37/244; H01J 37/18; H01J 37/28; H01J 37/26;
(Continued)

(56) References Cited

U.S. PATENT DOCUMENTS

2006/0186420 A1* 8/2006 Hirukawa ................ H01S 5/22 257/E25.032
2011/0187294 A1* 8/2011 Bergmann ........... H10H 20/811 315/363

(Continued)

FOREIGN PATENT DOCUMENTS

CN 1946827 A 4/2007
CN 102931301 A 2/2013

(Continued)

OTHER PUBLICATIONS

International Preliminary Report on Patentability mailed Jul. 28, 2022 for PCT/JP2020/044496.

*Primary Examiner* — Jason L McCormack
(74) *Attorney, Agent, or Firm* — Faegre Drinker Biddle & Reath LLP

(57) ABSTRACT

A light emitter is a light emitter for converting incident electrons into light, and includes a multiple quantum well structure for generating the light by incidence of the electrons, and an electron incident surface provided on the multiple quantum well structure. A certain barrier layer included in a plurality of barrier layers constituting the multiple quantum well structure is thicker than another barrier layer included in the plurality of barrier layers and located on the electron incident surface side with respect to the certain barrier layer.

3 Claims, 7 Drawing Sheets

(58) Field of Classification Search
CPC ....... H01J 2237/2441; H01J 2237/2443; H01J 2237/28; H01L 25/167; H01L 33/06; C09K 11/00; C09K 11/0883; C09K 11/62
USPC ................................ 250/306, 307, 310, 311
See application file for complete search history.

(56) References Cited

U.S. PATENT DOCUMENTS

| | | | | |
|---|---|---|---|---|
| 2014/0291613 | A1* | 10/2014 | Lin | H10D 62/8164 257/14 |
| 2017/0098746 | A1* | 4/2017 | Bergmann | H01L 33/22 |
| 2019/0259571 | A1* | 8/2019 | Cheifetz | G01T 1/20 |

FOREIGN PATENT DOCUMENTS

| | | | | |
|---|---|---|---|---|
| CN | 103730551 | A | 4/2014 | |
| CN | 108369977 | A | 8/2018 | |
| JP | H10-341028 | A | 12/1998 | |
| JP | 2005-298603 | A | 10/2005 | |
| JP | 2016-015379 | A | 1/2016 | |
| KR | 10-2017-0120688 | A | 10/2017 | |
| WO | WO-2007053624 | A2 * | 5/2007 | H10H 20/812 |

* cited by examiner

LIGHT-EMITTING BODY, ELECTRON BEAM DETECTOR, AND SCANNING ELECTRON MICROSCOPE

TECHNICAL FIELD

The present disclosure relates to a light emitter, an electron beam detector, and a scanning electron microscope.

BACKGROUND ART

Patent Document 1 discloses a technique related to a light emitter used in an electron beam detector. The light emitter is a light emitter for converting incident electrons into light, and includes a substrate, and a nitride semiconductor layer formed of InGaN and GaN. The substrate is transparent with respect to a wavelength of the light. The nitride semiconductor layer is formed on one surface of the substrate, and has a quantum well structure for generating the light by incidence of the electrons.

Patent Document 2 discloses a technique related to an electron beam excitation type light emitting epitaxial substrate and an electron beam excitation type light emitting device. The epitaxial substrate includes a substrate, a light emitting layer having a multiple quantum well structure provided on the substrate, and a metal layer provided on the light emitting layer. A band gap of a well layer of the light emitting layer increases stepwise in a thickness direction of the light emitting layer from the metal layer side to the substrate side. The number of well layers having the same band gap decreases in the thickness direction of the light emitting layer from the metal layer side to the substrate side. The well layer is formed of $Al_xGa_{1-x}$ ($0<x<1$) containing a dopant.

CITATION LIST

Patent Literature

Patent Document 1: Japanese Patent Application Laid-Open Publication No. 2005-298603

Patent Document 2: Japanese Patent Application Laid-Open Publication No. 2016-015379

SUMMARY OF INVENTION

Technical Problem

A light emitter which outputs light having an intensity according to an electron current amount of an incident electron beam is generally used in an electron beam detector. The electron beam detector measures the electron current amount of the electron beam by converting the intensity of light output from the light emitter into an electric signal. The above electron beam detector can be used in an apparatus such as a scanning electron microscope, for example. The light emitter includes a multiple quantum well structure for efficiently converting the incident electron beam into the light.

In the above light emitter, it may be desirable to improve light conversion efficiency from a low acceleration voltage to a high acceleration voltage. When the acceleration voltage for the incident electron beam is high, the electron beam reaches a deep position in the light emitter. Therefore, for improving the light conversion efficiency for the electron beam with the high acceleration voltage, it is desirable to thicken the multiple quantum well structure. When the multiple quantum well structure is thickened, there is a problem in that the light conversion efficiency is reduced for the electron beam with the low acceleration voltage which reaches only a shallow position in the light emitter.

An object of the present invention is to provide a light emitter, an electron beam detector, and a scanning electron microscope capable of improving light conversion efficiency from a low acceleration voltage to a high acceleration voltage.

Solution to Problem

An embodiment of the present invention is a light emitter. The light emitter is a light emitter for converting incident electrons into light, and includes a multiple quantum well structure for generating the light by incidence of the electrons; and an electron incident surface provided on the multiple quantum well structure, and a first barrier layer included in a plurality of barrier layers constituting the multiple quantum well structure is thicker than a second barrier layer included in the plurality of barrier layers and located on the electron incident surface side with respect to the first barrier layer.

In the above light emitter, when the electrons are incident on the multiple quantum well structure from the electron incident surface side, the light is generated by emission recombination (cathodoluminescence) in the well layer. The light is output to the outside of the light emitter.

In the above configuration, the second barrier layer located at a relatively shallow position from the electron incident surface is relatively thin, and thus, a well layer located on the opposite side of the electron incident surface with the second barrier layer interposed therebetween is disposed closer to the electron incident surface. Therefore, it is possible to improve light conversion efficiency for the electron beam with a low acceleration voltage. Further, the first barrier layer located at a relatively deep position is relatively thick, and thus, a well layer located on the opposite side of the electron incident surface with the first barrier layer interposed therebetween is disposed far from the electron incident surface. Therefore, it is possible to maintain the light conversion efficiency even for deep penetration of the electron beam with a high acceleration voltage.

In addition, as described later, since the electron beam spreads hemispherically inside the light emitter, the quantum wells disposed densely near the electron incident surface reliably capture the electrons even with the high acceleration voltage. Further, by changing the thickness of the barrier layer according to the distance from the electron incident surface as described above, it is possible to improve the light conversion efficiency from the low acceleration voltage to the high acceleration voltage.

According to the findings of the present inventors, since the electrons tend to diffuse hemispherically inside the multiple quantum well structure, an excitation density is high in the quantum well near the electron incident surface. Therefore, excitation of the quantum well by the diffusion electrons is reduced in the depth direction. Thus, it is desirable that the quantum well interval, being the barrier layer thickness, near the electron incident surface is thinner than the quantum well interval, being the barrier layer thickness, farthest from the electron incident surface.

An embodiment of the present invention is an electron beam detector. The electron beam detector includes the light emitter of the above configuration; a photodetector optically coupled to a surface of the multiple quantum well structure opposite to the electron incident surface and having sensitivity to the light generated in the multiple quantum well structure; and a light transmitting member interposed between the light emitter and the photodetector, and for integrating the light emitter and the photodetector and having an insulating property.

According to the above electron beam detector, by including the light emitter of the above configuration, it is possible to improve electron beam detection efficiency from the low acceleration voltage to the high acceleration voltage. Further, the insulating light transmitting member is interposed between the light emitter and the photodetector, and thus, the photodetector can be stably operated regardless of the voltage applied to the light emitter.

An embodiment of the present invention is a scanning electron microscope. The scanning electron microscope includes the light emitter of the above configuration; a photodetector optically coupled to a surface of the multiple quantum well structure opposite to the electron incident surface and having sensitivity to the light generated in the multiple quantum well structure; and a vacuum chamber in which at least the light emitter is installed, and the scanning electron microscope scans an electron beam on a surface of a sample disposed in the vacuum chamber, guides secondary electrons and reflected electrons from the sample to the light emitter, and captures an image of the sample by associating a scanning position on the sample with an output of the photodetector.

According to the above scanning electron microscope, by including the light emitter of the above configuration, it is possible to improve electron beam detection efficiency from the low acceleration voltage to the high acceleration voltage. Therefore, even when the imaging object has a deep depressed portion and/or a groove or the like, the corresponding portion can be clearly imaged using the high acceleration voltage and the other portion can be clearly imaged using the low acceleration voltage.

Advantageous Effects of Invention

According to the embodiments of the present invention, it is possible to provide a light emitter, an electron beam detector, and a scanning electron microscope capable of improving light conversion efficiency from a low acceleration voltage to a high acceleration voltage.

DESCRIPTION OF EMBODIMENTS

Hereinafter, embodiments of a light emitter, an electron beam detector, and a scanning electron microscope will be described in detail with reference to the accompanying drawings. In the description of the drawings, the same elements will be denoted by the same reference signs, and redundant description will be omitted. The present invention is not limited to these examples.

In addition, in the following description, a nitride semiconductor refers to a compound containing at least one of Ga, In, and Al as a group III element and containing N as a major group V element. Further, having a light transmitting property means a property of transmitting 50% or more of object light.

First Embodiment

Figure 1:
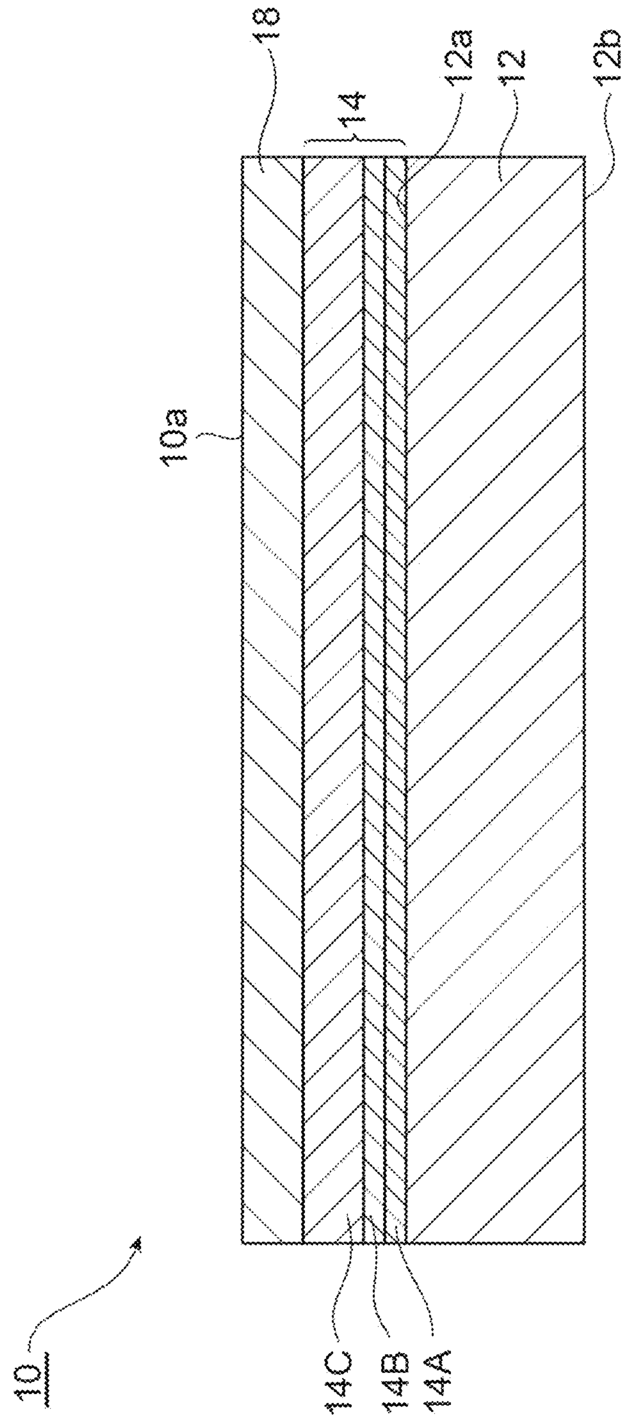
FIG. 1 is a cross-sectional view illustrating a configuration of a light emitter 10 according to a first embodiment.

FIG. 1 is a cross-sectional view illustrating a configuration of a light emitter 10 according to a first embodiment, and illustrates a cross section along a thickness direction. The light emitter 10 converts incident electrons into light. As illustrated in FIG. 1, the light emitter 10 includes a substrate 12, a nitride semiconductor layer 14 provided on a principal surface 12*a* of the substrate 12, and a conductive layer 18 provided on the nitride semiconductor layer 14. A surface of the conductive layer 18 constitutes an electron incident surface 10*a*.

The substrate 12 is a plate-shaped member having a light transmitting property for a wavelength of light output from the nitride semiconductor layer 14. A constituent material of the substrate 12 may be any material as long as it transmits the light output from the nitride semiconductor layer 14 and allows epitaxial growth of the nitride semiconductor layer 14. In one example, the substrate 12 is a sapphire substrate. Further, in one example, the substrate 12 transmits the light having a wavelength of 170 nm or more. The substrate 12 has the principal surface 12*a*, and a rear surface 12*b* located opposite to the principal surface 12*a*.

The nitride semiconductor layer 14 includes a first buffer layer 14A provided on the principal surface 12*a* of the substrate 12, a second buffer layer 14B provided on the first buffer layer 14A, and a multiple quantum well structure 14C provided on the second buffer layer 14B.

The first buffer layer 14A is a layer for growing the multiple quantum well structure 14C with good crystallinity, and is in contact with the principal surface 12*a*. The first buffer layer 14A is grown at a relatively low temperature (for example, 400° C. or more and 700° C. or less), and has, for example, an amorphous structure mainly containing gallium (Ga) and nitrogen (N). In one example, the first buffer layer 14A is formed of amorphous GaN. A thickness of the first buffer layer 14A is, for example, 5 nm or more and 500 nm or less, and in one example, is 20 nm.

The second buffer layer 14B is also a layer for growing the multiple quantum well structure 14C with good crystallinity, and for example, mainly contains a crystal of GaN. In one example, the second buffer layer 14B is formed of a crystal of GaN. The second buffer layer 14B is epitaxially grown at a higher temperature (for example, 700° C. or more and 1200° C. or less) than the first buffer layer 14A. A thickness of the second buffer layer 14B is, for example, 1

μm or more and 10 μm or less, and in one example, is 2.5 μm. The second buffer layer 14B may be in contact with the first buffer layer 14A.

Figure 2:
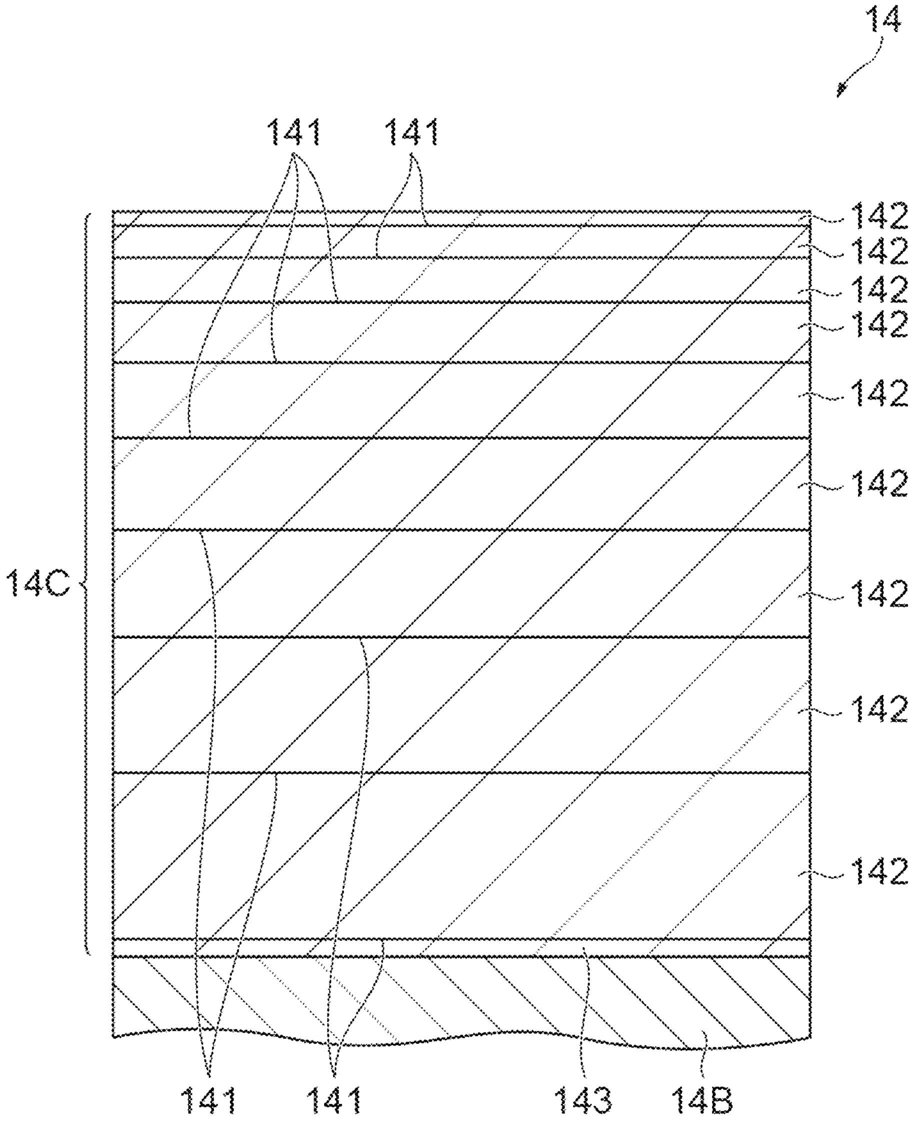
FIG. 2 is an enlarged cross-sectional view illustrating an internal structure of a multiple quantum well structure 14C.

The multiple quantum well structure 14C is a portion for generating the light by incidence of electrons, and is a layer epitaxially grown on the second buffer layer 14B. FIG. 2 is an enlarged cross-sectional view illustrating an internal structure of the multiple quantum well structure 14C. As illustrated in FIG. 2, the multiple quantum well structure 14C has a configuration in which well layers 141 and barrier layers 142 are alternately laminated.

The well layer 141 is constituted by containing a material which generates light by receiving electrons, and in the present embodiment, mainly contains a crystal of $In_xGa_{1-x}N$ (0<x<1). In one example, the well layer 141 is formed of a crystal of $In_xGa_{1-x}N$ (0<x<1) doped with Si. A Si doping concentration is $2\times10^{18}$ $cm^{-3}$, for example. In this case, when the electrons are incident, the well layer 141 generates the light having a wavelength around 415 nm. That is, when the electrons are incident on the multiple quantum well structure 14C, electron-hole pairs are generated, and the pairs recombine in the well layer 141 to generate the light (cathodoluminescence).

Compositions of the plurality of well layers 141 constituting the multiple quantum well structure 14C are the same as each other, and the above composition x is equal to each other. In one example, the composition x is 0.13. Further, thicknesses of the plurality of well layers 141 constituting the multiple quantum well structure 14C are equal to each other. The thickness of each well layer 141 is, for example, 0.2 nm or more and 5 nm or less, and in one example, is 1.5 nm.

A band gap energy of the barrier layer 142 is larger than a band gap energy of the well layer 141. By interposing the well layer 141 between the barrier layers 142, the electrons can be collected in the well layer 141 and efficiently converted into the light. In the present embodiment, the barrier layer 142 mainly contains a crystal of GaN.

In one example, the barrier layer 142 is formed of a crystal of GaN doped with Si. A Si doping concentration is $2\times10^{18}$ $cm^{-3}$, for example. In addition, the barrier layer 142 may further contain a group III atom (for example, In) other than Ga. Even in this case, the compositions of the plurality of barrier layers 142 constituting the multiple quantum well structure 14C are equal to each other.

Thicknesses of the plurality of barrier layers 142 constituting the multiple quantum well structure 14C are different from each other. Specifically, each barrier layer 142 is thicker than the barrier layer 142 located on the electron incident surface 10*a* (refer to FIG. 1) side with respect to each barrier layer 142. In other words, in the plurality of barrier layers 142, the thickness increases as the distance from the electron incident surface 10*a* increases, and the barrier layer 142 of the first layer closest to the electron incident surface 10*a* is a thinnest layer in the plurality of barrier layers 142.

In a preferred example, the thickness of the barrier layer 142 of the first layer closest to the electron incident surface 10*a* is 80% or less, and more preferably 20% or less, of an average thickness of the barrier layers 142. The thickness of the barrier layer 142 of the second layer (that is, the barrier layer 142 adjacent to the barrier layer 142 closest to the electron incident surface 10*a*) is 90% or less, and more preferably 80% or less, of the average thickness of the plurality of barrier layers 142.

The following Table 1 shows, as one example, the thicknesses of the respective barrier layers 142 in a case where the thicknesses of the barrier layers 142 of the first layer and the second layer are 9% and 65%, respectively, of the average thickness of the barrier layers 142. Further, the following Table 2 shows, as another example, the thicknesses of the respective barrier layers 142 in a case where the thicknesses of the barrier layers 142 of the first layer and the second layer are 80% and 90%, respectively, of the average thickness of the barrier layers 142. Further, the following Table 3 shows, as still another example, the thicknesses of the respective barrier layers 142 in a case where the thicknesses of the barrier layers 142 of the first layer and the second layer are 20% and 80%, respectively, of the average thickness of the barrier layers 142.

TABLE 1

| Barrier layer number | Thickness (nm) | Thickness difference from previous layer (nm) | Ratio of thickness difference from previous layer to overall average |
|---|---|---|---|
| 1st layer | 21 | — | — |
| 2nd layer | 146 | 125 | 3.6 |
| 3rd layer | 199 | 53 | 1.5 |
| 4th layer | 235 | 36 | — |
| 5th layer | 260 | 25 | — |
| 6th layer | 278 | 18 | — |
| 7th layer | 291 | 13 | — |
| 8th layer | 298 | 7 | — |
| 9th layer | 300 | 2 | — |
| Total thickness | 2028 | — | — |
| Average value | 225.3 | 34.9 | — |

TABLE 2

| Barrier layer number | Thickness (nm) | Thickness difference from previous layer (nm) | Ratio of thickness difference from previous layer to overall average |
|---|---|---|---|
| 1st layer | 180.0 | — | — |
| 2nd layer | 202.5 | 22.5 | 3.3 |
| 3rd layer | 234.6 | 32.1 | 4.7 |
| 4th layer | 234.6 | 0.0 | — |
| 5th layer | 234.6 | 0.0 | — |
| 6th layer | 234.6 | 0.0 | — |
| 7th layer | 234.6 | 0.0 | — |
| 8th layer | 234.6 | 0.0 | — |
| 9th layer | 234.6 | 0.0 | — |
| Total thickness | 2025 | — | — |
| Average value | 225 | 6.8 | — |

TABLE 3

| Barrier layer number | Thickness (nm) | Thickness difference from previous layer (nm) | Ratio of thickness difference from previous layer to overall average |
|---|---|---|---|
| 1st layer | 45.0 | — | — |
| 2nd layer | 180.0 | 135.0 | 5.1 |
| 3rd layer | 257.1 | 77.1 | 2.9 |
| 4th layer | 257.1 | 0.0 | — |
| 5th layer | 257.1 | 0.0 | — |
| 6th layer | 257.1 | 0.0 | — |
| 7th layer | 257.1 | 0.0 | — |
| 8th layer | 257.1 | 0.0 | — |
| 9th layer | 257.1 | 0.0 | — |
| Total thickness | 2025 | — | — |
| Average value | 225 | 26.5 | — |

In these examples, nine barrier layers 142 are provided. The first well layer 141 is provided between the barrier layer 142 of the first layer and the barrier layer 142 of the second layer counted from the electron incident surface 10*a* side. Subsequently, the n-th (n=2, . . . , 8) well layer 141 is provided between the barrier layer 142 of the n-th layer and the barrier layer 142 of the (n+1)-th layer counted from the electron incident surface 10*a* side.

In addition, a barrier layer 143 (refer to FIG. 2) having the same composition as each barrier layer 142 is provided between the last well layer (9th layer) 141 and the second buffer layer 14B. A thickness of the barrier layer 143 does not affect the characteristics of the light emitter 10, and is, for example, 10 nm. In addition, if necessary, the barrier layer 143 may not be provided.

In the example of the above Table 1, the barrier layer 142 becomes thicker as the distance from the electron incident surface 10*a* increases in all of the plurality of barrier layers 142, and further, even when, for example, a few barrier layers 142 included in a large number of barrier layers 142 do not satisfy the above condition, the effect of the present embodiment described later is hardly impaired. That is, in a case where a certain barrier layer 142 (first barrier layer) included in the plurality of barrier layers 142 is thicker than another barrier layer 142 (second barrier layer) located on the electron incident surface 10*a* side with respect to the certain barrier layer 142, the effect of the present embodiment described later is suitably exhibited.

In this case, the other barrier layer 142 may be the barrier layer 142 of the first layer closest to the electron incident surface 10*a* and of the thinnest layer. Further, as described above, the thickness of the barrier layer 142 of the first layer closest to the electron incident surface 10*a* may be set to 80% or less (more preferably 20% or less) of the average thickness of the barrier layers 142, and the thickness of the barrier layer 142 of the second layer may be set to 90% or less (more preferably 80% or less) of the average thickness of the plurality of barrier layers 142.

Further, in one expression, when the N (N is an integer of 1 or more) barrier layers 142 are divided into a first group of $N_1$ ($1 \leq N_1 \leq N-1$) layers on the electron incident surface 10*a* side and a second group of $N_2$ ($1 \leq N_2 \leq N-1$ and $N_1+N_2=N$) layers on the substrate 12 side, the average thickness of the barrier layers 142 of the first group may be smaller than the average thickness of the barrier layers 142 of the second group (in other words, the well layers 141 interposed in the first group are disposed densely, and the well layers 141 interposed in the second group are disposed sparsely).

Further, in the above Table 1 to Table 3, the thickness difference between the barrier layers 142 adjacent to each other is also shown. In the example shown in Table 1, the thickness difference between the barrier layers 142 adjacent to each other decreases as the distance from the electron incident surface 10*a* increases.

In addition, in the example shown in Table 1, the thickness difference between adjacent barrier layers 142 decreases as the distance from the electron incident surface 10*a* increases in all of the plurality of barrier layers 142, and further, even when, for example, a few barrier layers 142 included in a large number of barrier layers 142 do not satisfy the above condition, the effect described later is hardly impaired. That is, in a case where the thickness difference between a certain pair of barrier layers 142 adjacent to each other included in the plurality of barrier layers 142 is smaller than the thickness difference between another pair of barrier layers 142 adjacent to each other located on the electron incident surface 10*a* side with respect to the certain pair of barrier layers 142, the effect described later is suitably exhibited.

Further, the thickness difference between the barrier layer 142 of the first layer closest to the electron incident surface 10*a* and the barrier layer 142 of the second layer may be set to 3 times or more of the average thickness difference between the barrier layers 142 in the entire multiple quantum well structure 14C, and the thickness difference between the barrier layer 142 of the second layer and the barrier layer 142 of the third layer may be set to 1.2 times or more of the average thickness difference between the barrier layers 142 in the entire multiple quantum well structure 14C.

The conductive layer 18 is used as one electrode to guide electrons to the light emitter 10. The conductive layer 18 mainly contains, for example, a metal, and in one example, mainly contains Al. A thickness of the conductive layer 18 is, for example, 10 nm or more and 1000 nm or less, and in one example, is about 300 nm.

When the conductive layer 18 mainly contains a metal, the conductive layer 18 also functions as a light reflection film. That is, a part of the light generated in the multiple quantum well structure 14C directly reaches the substrate 12 from the multiple quantum well structure 14C and is output to the outside of the light emitter 10 by being transmitted through the substrate 12, and the remaining part of the light generated in the multiple quantum well structure 14C reaches the conductive layer 18 from the multiple quantum well structure 14C and is output to the outside of the light emitter 10 by being reflected by the conductive layer 18 and then transmitted through the substrate 12.

In addition, one example of a method for manufacturing the light emitter 10 will be described. First, the substrate 12 is introduced into a growth chamber of a metal-organic vapor phase epitaxy (MOVPE) apparatus, and subjected to heat treatment at 1100° C. for 10 minutes in a hydrogen atmosphere to clean the principal surface 12*a*. Further, the temperature of the substrate 12 is decreased to 500° C., and the first buffer layer 14A is deposited, and then, the temperature of the substrate 12 is increased to 1100° C., and the second buffer layer 14B is epitaxially grown.

Thereafter, the temperature of the substrate 12 is decreased to 800° C. to form the multiple quantum well structure 14C of $In_xGa_{1-x}N/GaN$. The composition x is in a range of 0.1 to 0.2, and is 0.15 in the present example, and further, the composition ratio is not limited to the above-described range, as long as the band gap of the well layer 141 is smaller than the band gap of the barrier layer 142.

Further, the substrate 12 is transferred into a deposition apparatus, and the conductive layer 18 is formed on the multiple quantum well structure 14C, thereby completing the fabrication of the light emitter 10.

In addition, in the example described above, trimethylgallium ($Ga(CH_3)_3$: TMGa) may be used as a Ga source, trimethylindium ($In(CH_3)_3$: TMIn) may be used as an In source, ammonia ($NH_3$) may be used as a N source, hydrogen gas ($H_2$) or nitrogen gas ($N_2$) may be used as a carrier gas, and monosilane ($SiH_4$) may be used as a Si source. Further, other metal-organic materials (for example, triethylgallium ($Ga(C_2H_5)_3$: TEGa), triethylindium ($In(C_2H_5)_3$: TEIn), and the like) and other hydrides (for example, disilane ($Si_2H_4$), and the like) may be used.

Further, the MOVPE apparatus is used in the example described above, and further, a hydride vapor phase epitaxy (HVPE) apparatus or a molecular beam epitaxy (MBE) apparatus may be used. Further, each growth temperature is not limited to the above temperature.

Effects obtained by the light emitter 10 of the present embodiment having the configuration described above will be described. In the light emitter 10, when electrons are incident on the multiple quantum well structure 14C from the electron incident surface 10*a* side, light is generated by emission recombination (cathodoluminescence) in the well layer 141. The light is transmitted through the substrate 12 and is output to the outside of the light emitter 10.

Figure 3:
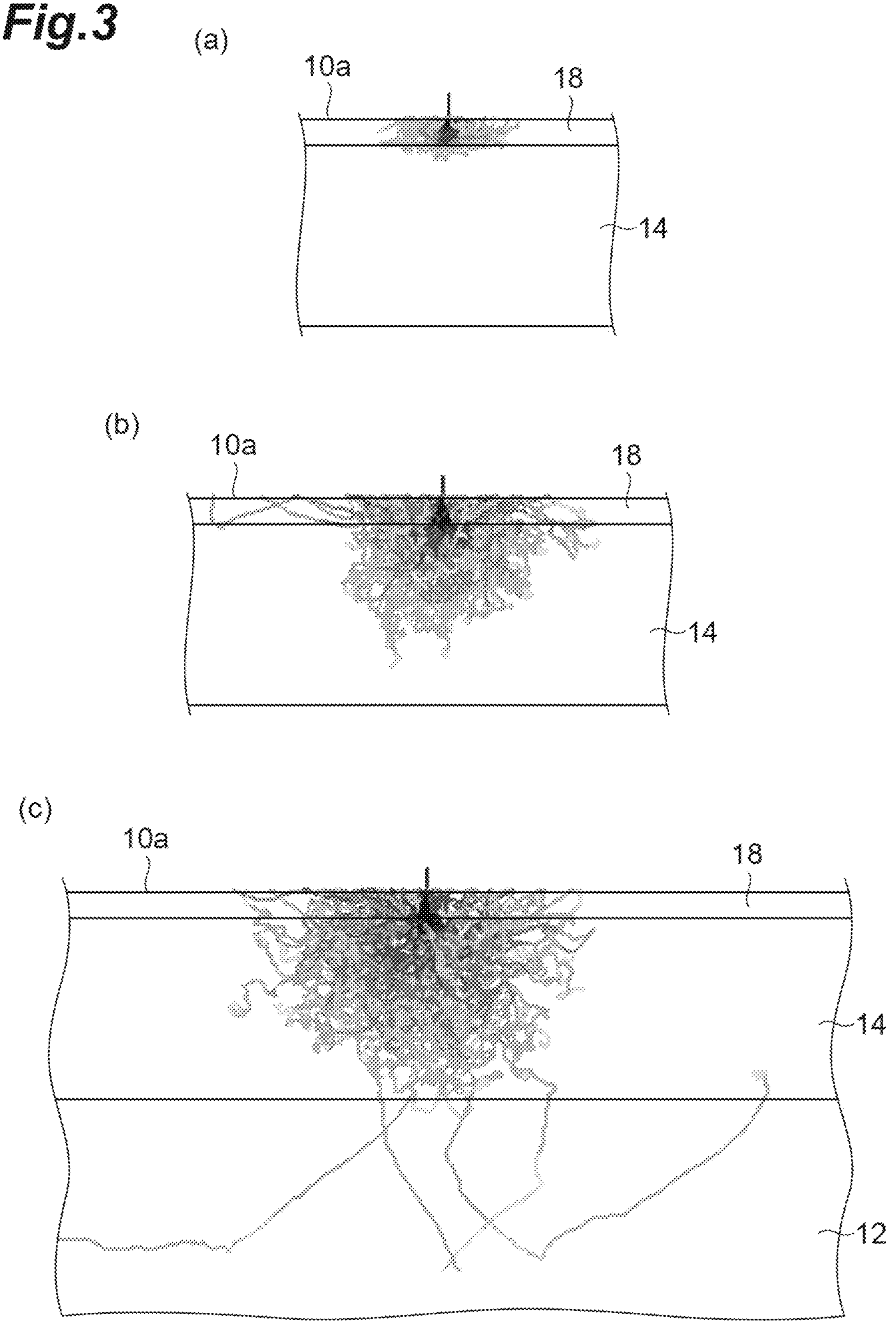
FIG. 3 includes (a)-(c) diagrams showing simulation results of electrons incident on and diffused in the light emitter 10 by a Monte Carlo method.

In addition, (a) to (c) in FIG. 3 are diagrams showing simulation results of electrons incident on and diffused in the light emitter 10 by a Monte Carlo method, and the electron density is shown by light and shade of color. The darker the color, the higher the electron density. (a) to (c) in FIG. 3 respectively show cases where the acceleration voltage for the electron beam is set to 10 kV, 30 kV, and 40 kV. As is clear from these figures, when the acceleration voltage for the electron beam is low, the electrons diffuse only in a shallow region of the light emitter 10 and do not deeply penetrate. On the other hand, when the acceleration voltage for the electron beam becomes high, the electrons penetrate into a deep region in the light emitter 10. Further, diffusion directions of the electrons in the light emitter 10 are random, and the electrons spread substantially hemispherically.

As described above, in the light emitter for converting electrons into light, it may be desirable to improve light conversion efficiency from a low acceleration voltage to a high acceleration voltage. As shown in (c) in FIG. 3, when the acceleration voltage for the incident electron beam is high, the electron beam reaches a deep position in the light emitter. Therefore, for improving the light conversion efficiency for the electron beam with the high acceleration voltage, it is desirable to increase the thickness of the multiple quantum well structure. For increasing the thickness of the multiple quantum well structure, the thickness of the barrier layer may be increased. However, in this case, there is a problem in that the light conversion efficiency is reduced for the electron beam with the low acceleration voltage which reaches only a shallow position in the light emitter.

In the present embodiment, the barrier layer 142 located at a relatively shallow position from the electron incident surface 10*a* is thinner than the barrier layer 142 located at a relatively deep position. Therefore, the well layer 141 located on the opposite side of the electron incident surface 10*a* with the barrier layer 142 located at a relatively shallow position interposed therebetween is disposed closer to the electron incident surface 10*a* than in the case where the thicknesses of the barrier layers 142 are equal. Thus, it is possible to improve the light conversion efficiency for the electron beam with the low acceleration voltage as shown in (a) in FIG. 3.

Further, the barrier layer 142 located at a relatively deep position is thicker than the barrier layer 142 located at a relatively shallow position. Therefore, the well layer 141 located on the opposite side of the electron incident surface 10*a* with the barrier layer 142 located at a relatively deep position interposed therebetween is disposed far from the electron incident surface 10*a*. Thus, it is possible to maintain the light conversion efficiency even for deep penetration of the electron beam with the high acceleration voltage as shown in (c) in FIG. 3.

In addition, as shown in (c) in FIG. 3, since the electron beam spreads hemispherically inside the light emitter 10, the quantum wells disposed densely near the electron incident surface 10*a* reliably capture the electrons even with the high acceleration voltage. Further, by changing the thickness of the barrier layer 142 according to the distance from the electron incident surface 10*a* as described above, it is possible to improve the light conversion efficiency from the low acceleration voltage to the high acceleration voltage.

According to the findings of the present inventors, since the electrons tend to diffuse hemispherically inside the multiple quantum well structure 14C, an excitation density is high in the quantum well near the electron incident surface 10*a*. Therefore, excitation of the quantum well by the diffusion electrons is reduced in the depth direction. Thus, it is desirable that the quantum well interval, being the thickness of the barrier layer 142, near the electron incident surface 10*a* is thinner than the quantum well interval, being the thickness of the barrier layer 142, farthest from the electron incident surface 10*a*.

Further, as in the present embodiment, the barrier layer 142 closest to the electron incident surface 10*a* in the plurality of barrier layers 142 may be a thinnest layer in the plurality of barrier layers 142. In this case, the position of the well layer 141 closest to the electron incident surface 10*a* is closer to the electron incident surface 10*a*. Thus, the light conversion efficiency for the electron beam with the low acceleration voltage can be further improved.

Further, as in the present embodiment, the thickness of the barrier layer 142 of the first layer closest to the electron incident surface 10*a* in the plurality of barrier layers 142 may be 80% or less of the average thickness of the plurality of barrier layers 142. In this case, the position of the well layer 141 closest to the electron incident surface 10*a* is close to the electron incident surface 10*a*. Thus, the light conversion efficiency for the electron beam with the low acceleration voltage can be further improved. More preferably, the thickness of the barrier layer 142 of the first layer may be 20% or less of the average thickness of the plurality of barrier layers 142.

Further, as in the present embodiment, the thickness of the barrier layer 142 of the second layer adjacent to the barrier layer 142 closest to the electron incident surface 10*a* in the plurality of barrier layers 142 may be 90% or less of the average thickness of the plurality of barrier layers 142. More preferably, the thickness of the barrier layer 142 of the second layer may be 80% or less of the average thickness of the plurality of barrier layers 142.

Further, as in the present embodiment, in the plurality of barrier layers 142, the thickness may increase as the distance from the electron incident surface 10*a* increases. In this case, an appropriate arrangement of the well layers 141 can be realized according to various magnitudes of the acceleration voltage, and the light conversion efficiency can be further improved.

Further, as in the present embodiment, it is preferable that the thickness difference between the barrier layers 142 adjacent to each other decreases as the distance from the electron incident surface 10*a* increases. As described above, the electrons tend to diffuse hemispherically inside the multiple quantum well structure 14C. Therefore, the diffusion electron amount decreases exponentially in the depth direction. Thus, when the thickness difference between the barrier layers 142 adjacent to each other decreases as the distance from the electron incident surface 10*a* increases, it is possible to realize a more appropriate arrangement of the well layers 141 according to the diffusion electron amount for each depth, and to significantly improve the light conversion efficiency.

Further, as in the present embodiment, the composition of the plurality of well layers 141 may be the same as each other. In this case, the multiple quantum well structure 14C can be easily fabricated.

Figure 4:
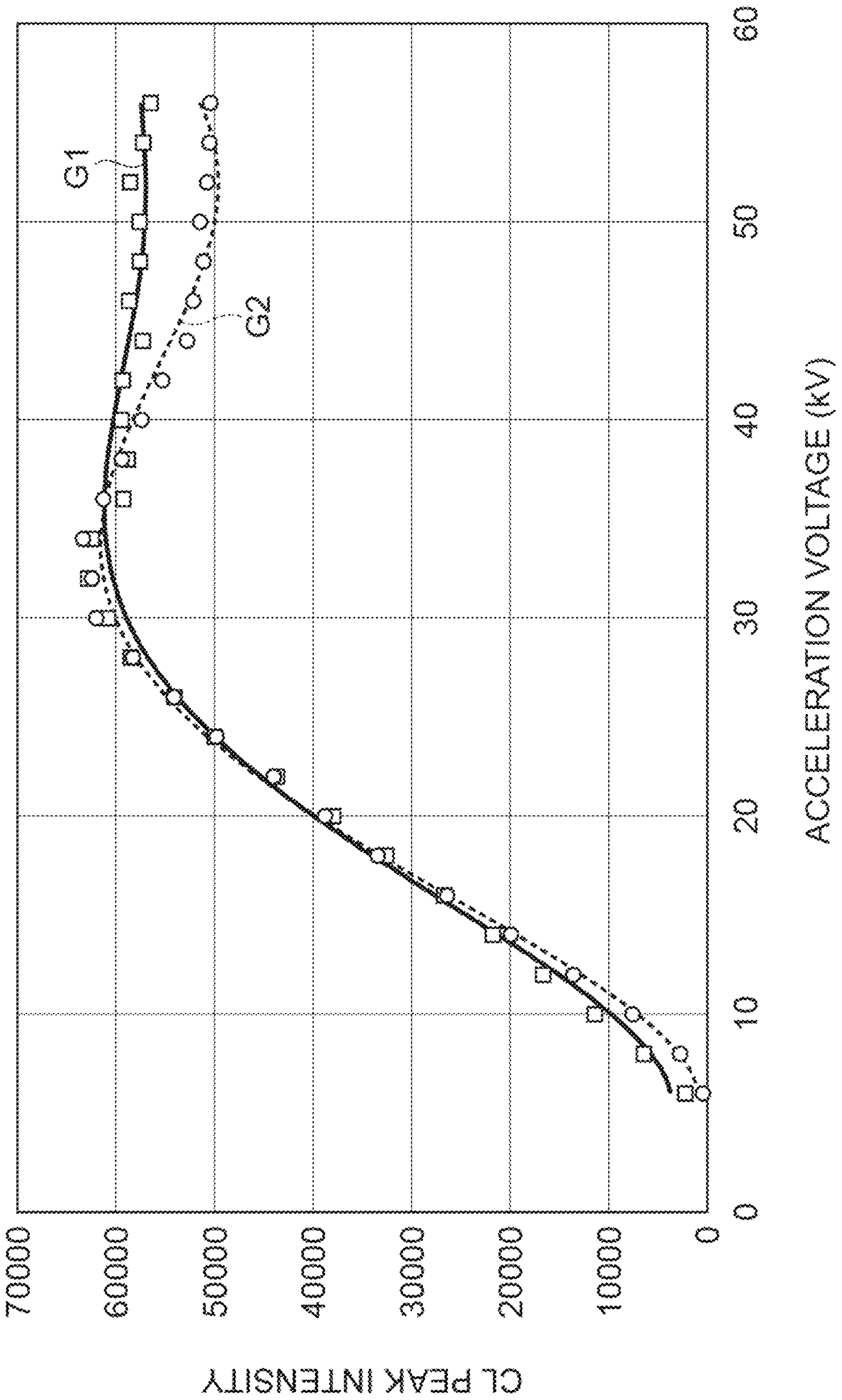
FIG. 4 is a graph showing a relation between an acceleration voltage of incident electrons and a peak intensity of cathodoluminescence, and a graph G1 shows a relation in the light emitter 10 of the present embodiment, and a graph G2 shows a relation when thicknesses of a plurality of barrier layers 142 are made uniform as a comparative example.
Figure 5:
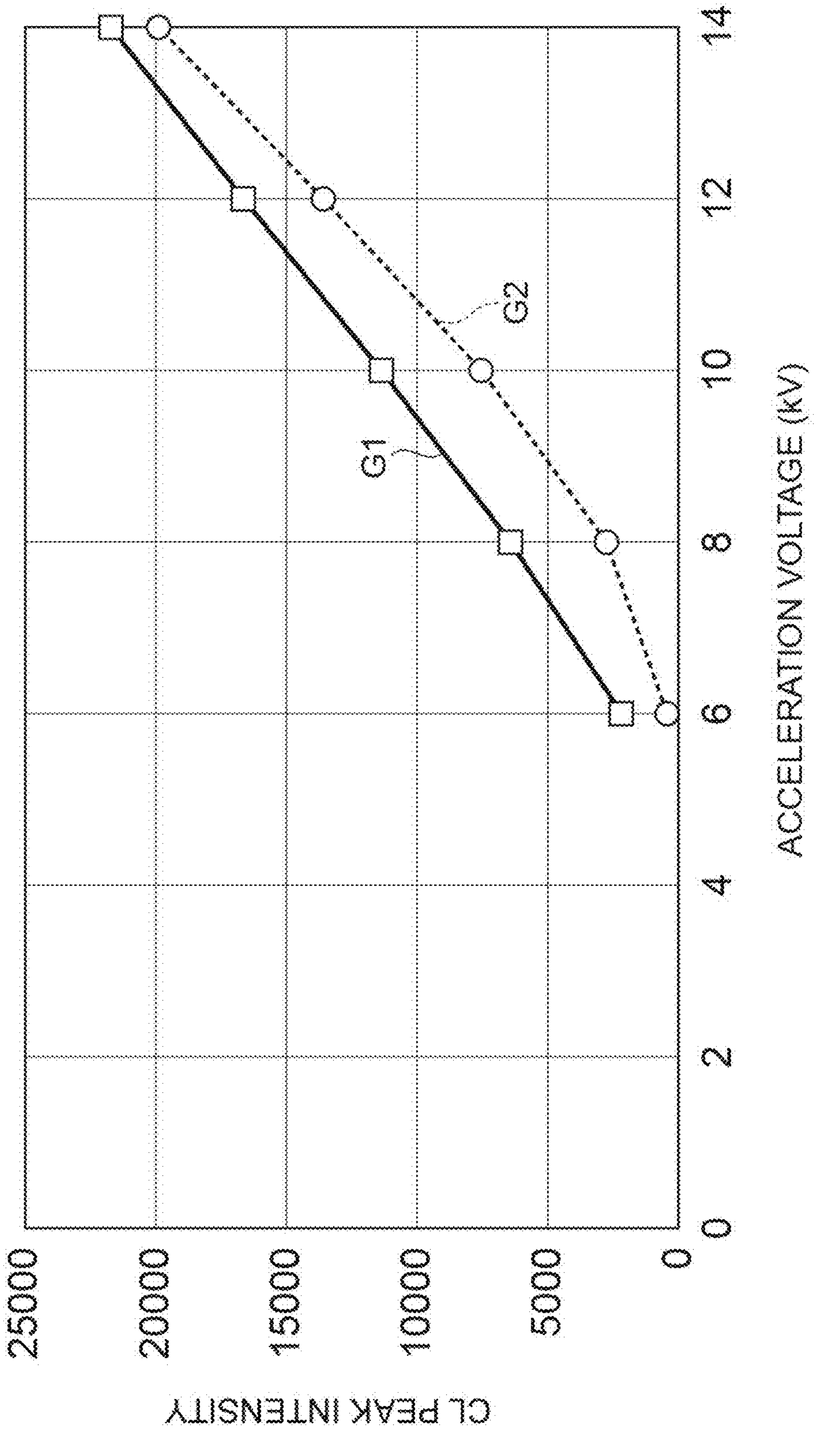
FIG. 5 is a graph showing a part of FIG. 4 in an enlarged manner.

In addition, a result of verifying the above effects will be described. A graph G1 in FIG. 4 is a graph showing a relation between an acceleration voltage for incident electrons and a peak intensity of cathodoluminescence (CL) (specifically, a peak count value of an emission spectrum at each acceleration voltage) in the light emitter 10 of the present embodiment (thicknesses of the barrier layers 142 are as shown in Table 1). Further, a graph G2 in FIG. 4 is a graph showing the relation when the thicknesses of the plurality of barrier layers 142 are made uniform as a comparative example. FIG. 5 is a graph showing a part of FIG. 4 in an enlarged manner. In the graph G2, the thicknesses of the barrier layers 142 are set to 225 nm. Further, in the graphs G1 and G2, the number of barrier layers 142 is set to 9.

In the present embodiment (graph G1), as shown in FIG. 5, the CL peak intensity in a region where the acceleration voltage is low is larger than that in the comparative example (graph G2). In particular, when the acceleration voltage is 6 kV, the CL peak intensity is about 5 times larger than that in the comparative example (graph G2), and when the acceleration voltage is 8 kV, the peak intensity is about 2 times larger than that in the comparative example. The above significant difference is considered to be caused by making the barrier layer 142 of the first layer extremely thin (21 nm) in the present embodiment.

Further, referring to FIG. 4, in a region where the acceleration voltage exceeds 40 kV, the CL peak intensity in the comparative example (graph G2) gradually decreases as the acceleration voltage increases. This is considered to be due to the fact that the electrons passing through the multiple quantum well structure gradually increase as the acceleration voltage increases.

On the other hand, the degree of decrease in the CL peak intensity in the present embodiment (graph G1) due to the increase in the acceleration voltage is suppressed compared with the comparative example (graph G2). This suggests that the light conversion efficiency is remarkably improved as compared with the comparative example (graph G2) by reliably capturing the electrons spreading spherically at the time of the high acceleration voltage by the quantum wells densely disposed near the surface.

Second Embodiment

Figure 6:
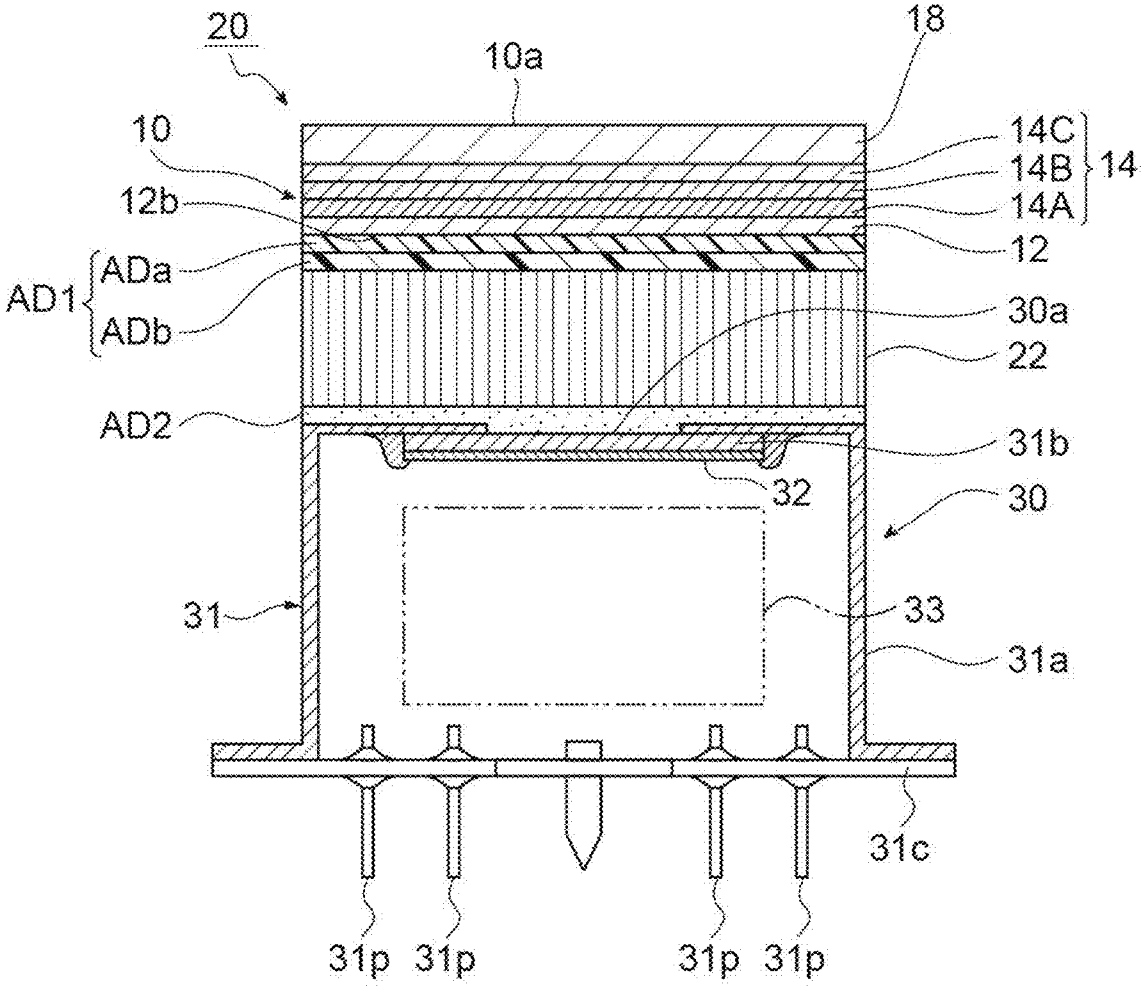
FIG. 6 is a cross-sectional view illustrating a configuration of an electron beam detector 20 according to a second embodiment.

FIG. 6 is a cross-sectional view illustrating a configuration of an electron beam detector 20 according to a second embodiment, and illustrates a cross section along a thickness direction. The electron beam detector 20 includes the light emitter 10 of the first embodiment, an insulating optical member (light guide member) 22, and a photodetector 30. The optical member 22 is an example of a light transmitting member in the present embodiment, has an insulating property, and is interposed between the light emitter 10 and the photodetector 30 for integrating the light emitter 10 and the photodetector 30.

The rear surface 12*b* of the substrate 12 of the light emitter 10 and a light incident surface 30*a* of the photodetector 30 are optically coupled via the optical member 22. Specifically, one end face of the optical member 22 is coupled to the light incident surface 30*a*, and the other end face of the optical member 22 is coupled to the light emitter 10. The optical member 22 may be a light guide such as a fiber optic plate (FOP), or may be a lens for focusing the light generated in the light emitter 10 onto the light incident surface 30*a*.

A light transmissive adhesion layer AD2 is interposed between the optical member 22 and the photodetector 30, and a relative position between the optical member 22 and the photodetector 30 is fixed by the adhesion layer AD2. The adhesion layer AD2 mainly contains, for example, a light transmissive resin. Further, an adhesion layer AD1 is interposed between the rear surface 12*b* of the substrate 12 of the light emitter 10 and the optical member 22.

The adhesion layer AD1 includes a SiN layer ADa provided on the rear surface 12*b*, and a $SiO_2$ layer ADb provided on the SiN layer ADa. In one example, the rear surface 12*b* and the SiN layer ADa are in contact with each other, and the SiN layer ADa and the $SiO_2$ layer ADb are in contact with each other. The $SiO_2$ layer ADb and the optical member 22 are fused to each other. Since both the $SiO_2$ layer ADb and the optical member 22 are silicified oxides, these can be fused by heating.

Since the $SiO_2$ layer ADb is formed on the SiN layer ADa using a sputtering method or the like, a bonding strength between the SiN layer ADa and the $SiO_2$ layer ADb is extremely high. Similarly, since the SiN layer ADa is also formed on the rear surface 12*b* of the substrate 12 using the sputtering method or the like, a bonding strength between the SiN layer ADa and the substrate 12 is extremely high. Therefore, the substrate 12 and the optical member 22 are strongly bonded to each other via the adhesion layer AD1. Further, the SiN layer ADa also functions as an anti-reflection film, and suppresses or reduces reflection of the light generated in the multiple quantum well structure 14C on the rear surface 12*b*.

In the electron beam detector 20 having the above structure, the light generated in the multiple quantum well structure 14C according to incidence of the electrons is sequentially transmitted through the adhesion layer AD1, the optical member 22, and the adhesion layer AD2 to reach the light incident surface 30*a* of the photodetector 30.

The light incident surface 30*a* of the photodetector 30 is, as described above, optically coupled to the surface of the multiple quantum well structure 14C opposite to the electron incident surface 10*a* via the substrate 12, the adhesion layer AD1, the optical member 22, and the adhesion layer AD2. The photodetector 30 has sensitivity to the light generated in the multiple quantum well structure 14C.

The photodetector 30 is, for example, a photomultiplier tube. In this case, the photodetector 30 includes a vacuum container 31. The vacuum container 31 includes a metal side tube 31*a*, a light incident window (face plate) 31*b* closing an opening at a top portion of the side tube 31*a*, and a stein plate 31*c* closing an opening at a bottom portion of the side tube 31*a*. In the vacuum container 31, a photocathode 32 formed on an inner surface of the light incident window 31*b* and an electrode unit 33 including an electron multiplier and an anode are disposed. The electron multiplier includes, for example, a microchannel plate or a mesh type dynode.

The light incident surface 30*a* is an outer surface of the light incident window 31*b*, and the light incident on the light incident surface 30*a* is transmitted through the light incident window 31*b* and incident on the photocathode 32. The photocathode 32 performs photoelectric conversion in response to incidence of the light, and emits generated photoelectrons into an internal space of the vacuum container 31.

The photoelectrons are multiplied by the electron multiplier of the electrode unit 33. The multiplied electrons are collected at the anode of the electrode unit 33. The electrons collected by the anode of the electrode unit 33 are extracted to the outside of the photodetector 30 through any of a plurality of pins 31*p* penetrating the stein plate 31*c*. In addition, a predetermined potential is applied to the electron multiplier of the electrode unit 33 via another pin 31*p*. A potential of the metal side tube 31*a* is 0 V, and the photocathode 32 is electrically coupled to the side tube 31*a*.

The electron beam detector 20 of the present embodiment described above includes the light emitter 10 of the first embodiment. Thus, it is possible to improve the electron beam detection efficiency from the low acceleration voltage to the high acceleration voltage. Further, the insulating optical member 22 is interposed between the light emitter 10 and the photodetector 30, and thus, the photodetector 30 can be stably operated regardless of the voltage being applied to the light emitter 10.

Third Embodiment

Figure 7:
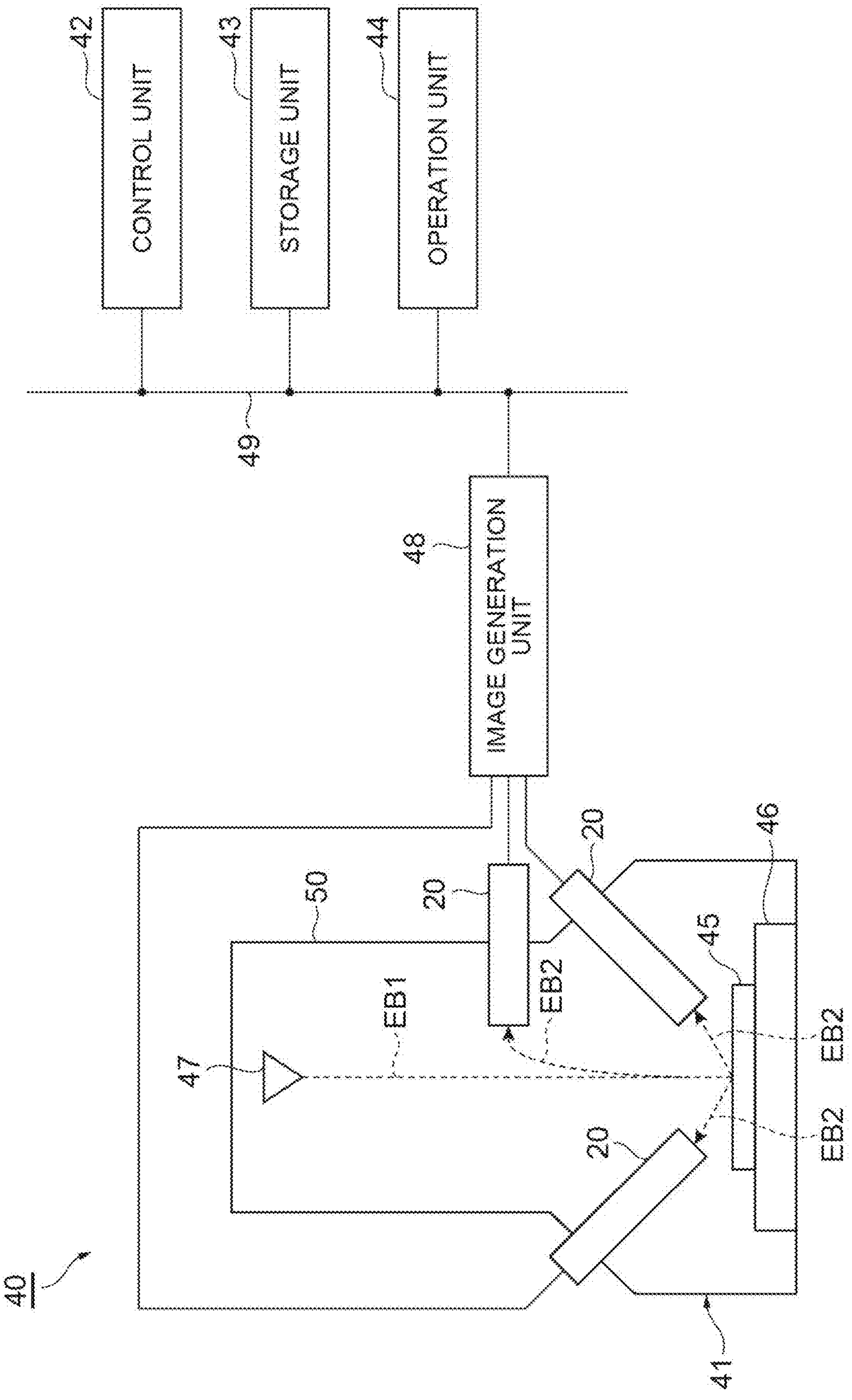
FIG. 7 is a diagram schematically illustrating a configuration of a critical dimension SEM 40 according to a third embodiment.

The electron beam detector 20 of the second embodiment can be used in a scanning electron microscope (SEM), a mass spectrometer, and the like. FIG. 7 is a diagram schematically illustrating a configuration of a critical dimension SEM 40 according to a third embodiment. The critical dimension SEM 40 includes an SEM 41 for acquiring an image of an inspection object, a control unit 42 for performing overall control, a storage unit 43 for storing the acquired image and the like in a magnetic disk, a semiconductor memory, or the like, and an operation unit 44 for performing operation according to a program.

The SEM 41 includes a movable stage 46 on which a sample wafer 45 is mounted, an electron source 47 for irradiating the sample wafer 45 with an electron beam EB1, and a plurality of (three in the example illustrated in the figure) electron beam detectors 20 for detecting secondary electrons and reflected electrons generated from the sample wafer 45. The configuration of the electron beam detector 20 is the same as that in the second embodiment. In addition, the SEM 41 includes an electron lens (not illustrated) for focusing the electron beam EB1 on the sample wafer 45, a deflector (not illustrated) for scanning the electron beam EB1 on the sample wafer 45, an image generation unit 48 for digitally converting a signal from each electron beam detector 20 to generate a digital image, and the like.

The movable stage 46, the electron source 47, at least the light emitter 10 in the electron beam detector 20, the electron lens, and the deflector are installed in a vacuum chamber 50. The image generation unit 48 and each electron beam detector 20 are electrically coupled to each other via wiring. The image generation unit 48, the control unit 42, the storage unit 43, and the operation unit 44 are electrically coupled to each other via a data bus 49.

When a surface of the sample wafer 45 is scanned by the electron beam EB1 while irradiating the sample wafer 45 with the electron beam EB1, secondary electrons and reflected electrons are emitted from the surface of the sample wafer 45, and are guided to the electron beam detector 20 as an electron beam EB2. The electron beam detector 20 converts the electron beam EB2 into an electric signal, and the electric signal is output from the pin 31*p* (refer to FIG. 6) according to an electron current amount of the electron beam EB2. The image of the sample wafer 45 can be acquired by synchronizing and associating the scanning position of the electron beam EB1 with the output of the electron beam detector 20.

The control unit 42 has a function of controlling transfer of the sample wafer 45, a function of controlling the movable stage 46, a function of controlling the irradiation position of the electron beam EB1, and a function of controlling scanning of the electron beam EB1. The storage unit 43 has an area for storing the acquired image data and an area for storing imaging conditions (for example, an acceleration voltage and the like). The operation unit 44 has a function of calculating a dimension of a component (a width of a groove or the like) based on light and shade (contrast) in the image data.

In addition, the control unit 42 and the operation unit 44 may be constituted as hardware designed to realize the respective functions, or may be implemented as software and executed by using a general-purpose operation device (for example, a CPU, a GPU, or the like).

The critical dimension SEM 40 according to the present embodiment includes the light emitter 10 of the first embodiment. Thus, it is possible to improve the electron beam detection efficiency from the low acceleration voltage to the high acceleration voltage. Therefore, even when the sample wafer 45 has a deep depressed portion and/or a groove or the like, the corresponding portion can be clearly imaged using the high acceleration voltage and the other portion can be clearly imaged using the low acceleration voltage.

For example, when measuring a shape of each layer (wiring width or the like) in a multilayer semiconductor device such as a semiconductor memory device, a low acceleration voltage (for example, 3 to 5 keV) is sufficient to cause secondary electrons and reflected electrons to reach the light emitter 10 from the outermost layer of the semiconductor device, but a high acceleration voltage (for example, 30 keV or more) is required to cause secondary electrons and reflected electrons to reach the light emitter 10 from the deepest layer.

According to the critical dimension SEM 40 of the present embodiment, since the electron beam detection efficiency can be improved from the low acceleration voltage to the high acceleration voltage, it is possible to clearly measure the shape and dimension of each layer in the multilayer semiconductor device.

The light emitter, the electron beam detector, and the scanning electron microscope are not limited to the embodiments and configuration examples described above, and may be modified in various ways. For example, compositions, dopant concentrations, and thicknesses of the well layers 141 and the barrier layers 142 constituting the multiple quantum well structure 14C are not limited to the examples described above.

Further, the first buffer layer 14A and the second buffer layer 14B are GaN layers in the above example, and further, other compositions may be applied as long as the nitride semiconductor contains at least one or more of In, Al, and Ga as a group III element, contains N as a major group V element, and has a light transmitting property for an emission wavelength of the multiple quantum well structure 14C.

Further, in the above example, the well layer 141 and the barrier layer 142 in the multiple quantum well structure 14C are doped with Si, and further, without being limited thereto, other impurities (for example, Mg) may be doped, and doping may not be performed as necessary.

Further, the well layer 141 and the barrier layer 142 of the multiple quantum well structure 14C may be formed of $In_xAl_yGa_{1-x-y}N$ ($0 \le x \le 1$, $0 \le y \le 1$, $0 \le x+y \le 1$). Therefore, in addition to the combination of InGaN/GaN described above, for example, combinations of InGaN/AlGaN, InGaN/InGaN, GaN/AlGaN, and the like can be used. Further, the well layer 141 and the barrier layer 142 may be formed of a semiconductor other than a nitride semiconductor.

Further, in the above example, the number of layers of each of the well layer 141 and the barrier layer 142 is set to 9, and further, the number of layers of each of the well layer 141 and the barrier layer 142 may be an arbitrary number of layers of two or more. Further, the thicknesses of the barrier layers 142 shown in Table 1 is an example, and the barrier layers 142 can have various other thicknesses.

Further, the photodetector 30 in FIG. 6 is not limited to the photomultiplier tube, and may be, for example, an avalanche photodiode. Further, the optical member 22 is not limited to a linear shape, but may be a curved shape, and the size thereof may be appropriately changed.

The light emitter of the above embodiment is a light emitter for converting an incident electron into light, and includes a multiple quantum well structure for generating the light by incidence of the electron; and an electron incident surface provided on the multiple quantum well structure, and a first barrier layer included in a plurality of barrier layers constituting the multiple quantum well structure is thicker than a second barrier layer included in the plurality of barrier layers and located on the electron incident surface side with respect to the first barrier layer.

In the above light emitter, the second barrier layer may be a barrier layer closest to the electron incident surface in the plurality of barrier layers. Further, in this case, the second barrier layer may be a thinnest layer in the plurality of barrier layers. According to the above configuration, the position of the well layer closest to the electron incident surface is closer to the electron incident surface. Thus, the light conversion efficiency for the electron beam with the low acceleration voltage can be further improved.

In the above light emitter, the second barrier layer may be the barrier layer closest to the electron incident surface in the plurality of barrier layers, and a thickness of the second barrier layer may be 80% or less of an average thickness of the plurality of barrier layers. In this case, the position of the well layer closest to the electron incident surface is close to the electron incident surface. Thus, the light conversion efficiency for the electron beam with the low acceleration voltage can be further improved. Further, in the above configuration, the thickness of the second barrier layer may be 20% or less of the average thickness of the plurality of barrier layers.

Further, in the above light emitter, the first barrier layer may be a barrier layer adjacent to the barrier layer closest to the electron incident surface in the plurality of barrier layers, and a thickness of the first barrier layer may be 90% or less of an average thickness of the plurality of barrier layers. Further, in the above configuration, the thickness of the first barrier layer may be 80% or less of the average thickness of the plurality of barrier layers.

In the above light emitter, in the plurality of barrier layers, a thickness may increase as a distance from the electron incident surface increases. In this case, an appropriate arrangement of the well layers can be realized according to various magnitudes of the acceleration voltage, and the light conversion efficiency can be further improved.

In the above light emitter, a thickness difference between the barrier layers adjacent to each other may decrease as a distance from the electron incident surface increases.

In the above light emitter, a composition of a plurality of well layers constituting the multiple quantum well structure may be the same as each other. In this case, fabrication of the multiple quantum well structure is facilitated.

The electron beam detector of the above embodiment includes the light emitter of the above configuration; a photodetector optically coupled to a surface of the multiple quantum well structure opposite to the electron incident surface and having sensitivity to the light generated in the multiple quantum well structure; and a light transmitting member interposed between the light emitter and the photodetector, and for integrating the light emitter and the photodetector and having an insulating property.

The scanning electron microscope of the above embodiment includes the light emitter of the above configuration; a photodetector optically coupled to a surface of the multiple quantum well structure opposite to the electron incident surface and having sensitivity to the light generated in the multiple quantum well structure; and a vacuum chamber in which at least the light emitter is installed, and the scanning electron microscope scans an electron beam on a surface of a sample disposed in the vacuum chamber, guides secondary electrons and reflected electrons from the sample to the light emitter, and captures an image of the sample by associating a scanning position on the sample with an output of the photodetector.

INDUSTRIAL APPLICABILITY

The present invention can be used as a light emitter, an electron beam detector, and a scanning electron microscope capable of improving light conversion efficiency from a low acceleration voltage to a high acceleration voltage.

REFERENCE SIGNS LIST

10—light emitter, 10*a*—electron incident surface, 12—substrate, 12*a*—principal surface, 12*b*—rear surface, 14—nitride semiconductor layer, 14A—first buffer layer, 14B—second buffer layer, 14C—multiple quantum well structure, 18—conductive layer, 20—electron beam detector, 22—optical member, 30—photodetector, 30*a*—light incident surface, 31—vacuum container, 31*a*—side tube, 31*b*—light incident window, 31*c*—stein plate, 31*p*—pin, 32—photocathode, 33—electrode unit, 40—critical dimension SEM, 41—scanning electron microscope (SEM), 42—control unit, 43—storage unit, 44—operation unit, 45—sample wafer, 46—movable stage, 47—electron source, 48—image generation unit, 49—data bus, 50—vacuum chamber, 141—well layer, 142, 143—barrier layer, AD1, AD2—adhesion layer, ADa—SiN layer, ADb—$SiO_2$ layer, EB1, EB2—electron beam.

The invention claimed is:

1. A light emitter for converting incident electrons into light, the light emitter comprising:

a multiple quantum well structure having a configuration in which a plurality of well layers and a plurality of barrier layers are alternately laminated and configured to generate the light by incidence of the electrons; and an electron incident surface provided on the multiple quantum well structure, wherein when the electrons are incident on the multiple quantum well structure from the electron incident surface side, the light is generated by cathodoluminescence in the plurality of well layers, the plurality of barrier layers constituting the multiple quantum well structure include a first barrier layer, and a second barrier layer located on the electron incident surface side with respect to the first barrier layer, and the second barrier layer is a barrier layer closest to the electron incident surface in the plurality of barrier layers, and the first barrier layer is thicker than the second barrier layer, and a thickness difference between the barrier layers adjacent to each other decreases as a distance from the electron incident surface increases.

2. An electron beam detector comprising:

the light emitter according to claim 1;

a photodetector optically coupled to a surface of the multiple quantum well structure opposite to the electron incident surface and having sensitivity to the light generated in the multiple quantum well structure; and a light transmitting member interposed between the light emitter and the photodetector, and configured to integrate the light emitter and the photodetector and have an insulating property.

3. A scanning electron microscope comprising:

the light emitter according to claim 1;

a photodetector optically coupled to a surface of the multiple quantum well structure opposite to the electron incident surface and having sensitivity to the light generated in the multiple quantum well structure; and a vacuum chamber in which at least the light emitter is installed, wherein the scanning electron microscope is configured to scan an electron beam on a surface of a sample disposed in the vacuum chamber, guide secondary electrons and reflected electrons from the sample to the light emitter, and capture an image of the sample by associating a scanning position on the sample with an output of the photodetector.

* * * * *